United States Patent [19]
Packwood

[11] Patent Number: 5,358,881
[45] Date of Patent: Oct. 25, 1994

[54] SILICON TOPOGRAPHY CONTROL METHOD

[75] Inventor: Donald L. Packwood, San Jose, Calif.

[73] Assignee: Hewlett-Packard Company, Palo Alto, Calif.

[21] Appl. No.: 64,296

[22] Filed: May 19, 1993

[51] Int. Cl.⁵ .................................. H01L 21/265
[52] U.S. Cl. .................................. 437/26; 437/97; 437/90; 437/31
[58] Field of Search ............ 437/26, 985, 97, 28; 148/116

[56]  References Cited

U.S. PATENT DOCUMENTS

| | | |
|---|---|---|
| 3,909,304 | 9/1975 | Cho ........................ 437/26 |
| 3,950,188 | 4/1976 | Bower ...................... 437/28 |
| 4,239,559 | 12/1980 | Ito ......................... 437/97 |
| 4,717,687 | 1/1988 | Verma ..................... 437/985 |
| 4,737,468 | 4/1988 | Martin ..................... 437/26 |

FOREIGN PATENT DOCUMENTS

| | | | |
|---|---|---|---|
| 0132260 | 11/1978 | Japan ..................... 437/97 |
| 0061625 | 4/1983 | Japan ..................... 437/26 |
| 0056437 | 3/1986 | Japan ..................... 437/985 |
| 0094954 | 5/1987 | Japan ..................... 437/985 |
| 0010754 | 1/1990 | Japan ..................... 437/985 |
| 036815A | 1/1991 | Japan ..................... 437/985 |

*Primary Examiner*—Tom Thomas
*Assistant Examiner*—Lynne A. Gurley

[57] ABSTRACT

A semiconductor method for establishing a predetermined, constant-depth recess in a semiconductor structure fabricated on the surface of a silicon substrate or wafer. Fabrication includes first growing a thin screen oxide layer on the surface of the wafer. Next, polysilicon is deposited over the screen oxide. Then, windows are defined for ion implantation of buried dopant layers. The window regions are then etched away to the level of the screen oxide. The patterned window resist layer is retained to shield the implant and to enable dopant ions to penetrate the silicon crystal substrate only within defined window regions. At the end of fabrication, the resist pattern is removed and the semiconductor structure is annealed and oxidized.

9 Claims, 4 Drawing Sheets

SILICON TOPOGRAPHY CONTROL METHOD

TECHNICAL FIELD

The field of this invention is directed toward silicon topography control methods and more particularly toward the field of techniques for decoupling the depth of selected structural recesses fabricated in semiconductor devices from the thickness of the oxide used to produce the recesses.

BACKGROUND

In semiconductor processing of bipolar transistors, it is frequently desirable to implant a low-resistance buried layer below the active area of the transistor, effective to reduce the resistance of the transistor collector and to improve the frequency response of the desired bipolar transistor at high-collector current by limiting high-current base pushout. According to the prior known techniques, the dopant applied to the buried layer is generally introduced by implantion of high energy ions of the selected dopant into the silicon crystal. After a diffusion step to distribute the dopant to its final configuration within the silicon crystal, a new layer of silicon is epitaxially deposited to form a region having a resistivity suitable for forming the active area of the bipolar transistors to be fabricated. Unfortunately, the ion implantation step discussed immediately above seriously disturbs the crystalline perfection of the underlying silicon. Even including an anneal step which is effective to restore a substantial amount of the previous crystalline formation does not restore the silicon surface to its former level of perfection. The imperfections produced in the underlying crystalline surface will unfortunately be replicated into the crystalline structure of the epitaxially deposited silicon. These imperfections, to the extent they lie in the active area of a bipolar transistor, can result in devices which leak current and have a tendency to short circuit. A known approach to address the problem of such imperfections in the crystalline structure is to oxidize away the affected imperfect silicon layer after fabrication of the buried layer is completed. The oxide itself is then finally etched away prior to epitaxial growth of a new, more perfect silicon layer. In succeeding steps, the active transistor is then accurately aligned over the buried layers described above.

A depression is desirably formed in the silicon at the location of the buried layers to mark where the subsequent masking steps are placed. One approach is the local oxidation approach, according to which a layer of $Si_3N_4$ is applied to prevent surface oxidation except in the region of the buried layer windows where the nitride has been etched away. If the implant range is at about 1,500 angstrom beneath the surface of the crystal, over 3,000 angstrom of oxide will have to be oxidized to completely remove the implanted material. As a result, a depression of about 1,500 angstrom in depth will remain in the silicon. This local oxidation scheme also causes a great deal of damage to the buried layer windows themselves due to the growing oxide trying to expand against the rigid nitride film. This may also cause crystalline damage to the silicon which is replicated onto the epitaxially grown silicon layer.

Another approach which is known to enable creation of desired topographies on the surface of a silicon wafer includes applying a thick layer of initial oxide and to etch windows in the thick oxide where the buried layers are to be placed. It is through the windows extending through this oxide material that implantation is accomplished. When the implant damage is oxidized away and the alignment topography has been established, a thick oxide layer is grown in the bare buried layer windows. The oxidation of silicon under the thick oxide is inhibited, because the oxidizing species slowly have to diffuse through the thick oxide already present. Thus more silicon is oxidized away in the window area than in the areas under the thick oxide. After this oxide is removed before the epitaxial deposition described above, a depression is left in the silicon at the locations of the windows. This known approach is workable, but it is also disadvantageous, in part because the depth of the resulting topography, which is established in the silicon surface, is coupled to the oxide grown after implant. During processing, these thicknesses are balanced only with difficulty. Further, the process is complicated and time-consuming, requiring extensive oxidation steps. Additionally, because the oxide grows more thickly in the selected windows, differential stresses are created which can lead to wafer warpage and crystal imperfections unless thermal handling is carefully done.

It is accordingly an object of the invention herein to develop an approach to establishing the desired, doped active implanted region, and to ensure a highly perfect crystalline structure in the active region which is not subject to leakage currents and short circuit burdens.

Further, it is an object of the invention to localize the position of the doped region for further, suitably aligned semiconductor processing steps to be followed in device manufacture.

Additionally, it is desired to accomplish the above with a minimum in topographical variation. This is desired to avoid difficulties with critical dimensions of the devices under manufacture and fabrication, and further to ensure control of the exact size and dimensions of critical features. With too much topographical variation, undesired etching problems may arise during subsequent processing steps during fabrication.

Finally, it is desired to develop an approach to elimination of crystalline defects which is effective for removing substantially all desired defective regions without carving out an excessive amount of silicon and leaving extreme topographical depressions in the silicon surface which might detrimentally affect subsequent processing steps.

SUMMARY OF THE INVENTION

According to the invention, the establishment of a constant silicon recess of predetermined thickness is accomplished on the surface of a selected silicon substrate or wafer. The thickness of the desired silicon recess is independent of the thickness of the oxide grown. According to a particular version of the invention, a thin screen oxide layer is first grown on the surface of a selected wafer or substrate. Next, a layer of polysilicon is deposited over the screen oxide. The thickness of this polysilicon layer is effective for defining the desired thickness of the recess desired to be established in the silicon surface. Then, a photolithographic step defines selected windows through which ion implantation for the buried layer or layers is to be accomplished. This leaves a resist pattern defining the windows on the surface of the polysilicon layer. The polysilicon in the windows is then etched away to the level of the screen oxide previously grown. The resist pattern is retained to shield the implant, and to enable dopant ions to penetrate the silicon crystal substrate only within defined window regions. The resist pattern is then finally removed. Annealing of the wafer or substrate is next accomplished. Thereafter, the entire semiconductor structure including the initial wafer or substrate is oxidized. The oxide is then removed and an epitaxial layer of silicon is then applied conformally, leaving a step recess of predetermined depth in place to enable device alignment for subsequent semiconductor processing steps. As a result, the invention enables establishment of a uniform oxide thickness over the surface of the substrate or wafer, reducing strain and warpage in the affected semiconductor materials.

DETAILED DESCRIPTION OF THE BEST MODE AND PREFERRED EMBODIMENT OF THE INVENTION

Figure 1:
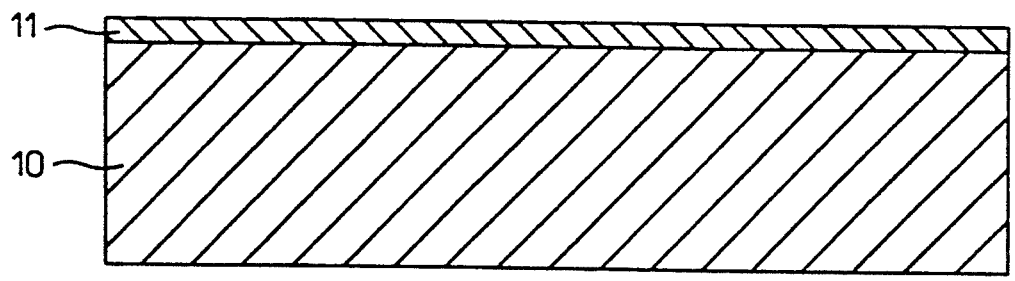
FIG. 1 shows in side cross-section a substrate wafer of silicon with a layer of oxide grown thereupon, according to the invention herein.
Figure 2:
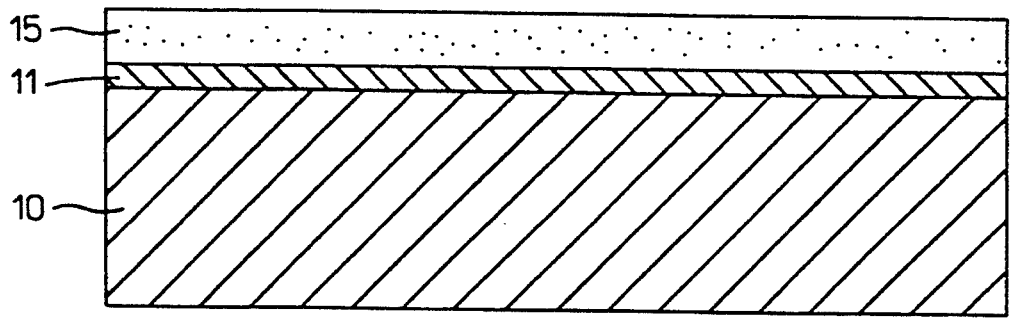
FIG. 2 shows the cross-sectional view of the substrate wafer and the oxide layer with a layer of polysilicon of predetermined thickness deposited thereover.

FIG. 1 shows in side cross-section a substrate wafer 10 of polysilicon crystal with a thin-screen oxide layer 11 grown thereupon. As is well-known, the wafer 10 may be cut into a plurality of semiconductor chips at the end of fabrication. A typical semiconductor substrate wafer 10 comes in many thicknesses. As will be apparent below, the invention is applicable for wafers of any typical thickness in the art. The oxide layer 11 is approximately fifty (50) to two-hundred (200) angstroms thick, for example. The growth of the oxide layer 11 upon a wafer 10 or a semiconductor substrate of another kind is a first step of the inventive method addressed herein. FIG. 2 shows the accomplishment a next inventive step according to which the structure of FIG. 1 is enhanced by including a layer of polysilicon 15 which is deposited over the previously-grown oxide layer 11. This deposited layer of polysilicon 15 is applied according to conventional techniques to a predetermined thickness, which, as will be discussed, defines the topography step thickness which is desirably established according to the invention herein.

Figure 3:
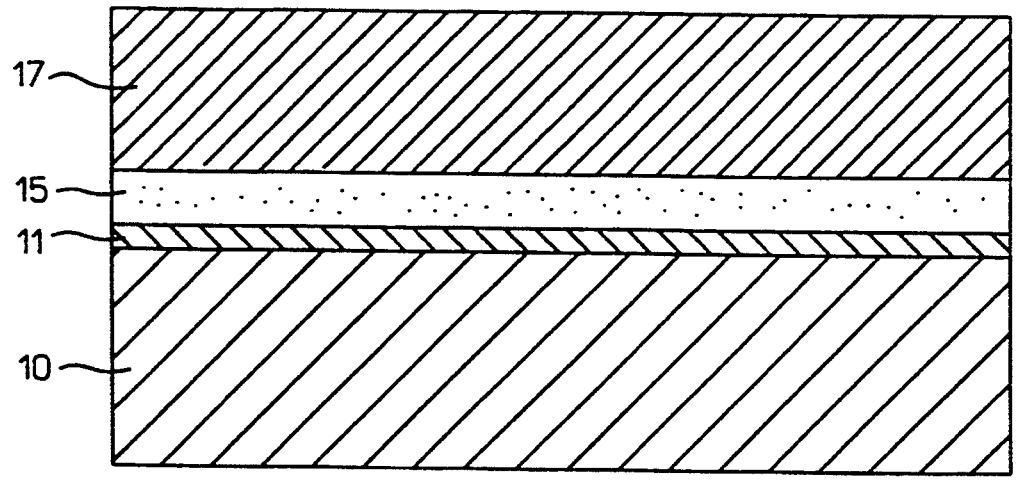
FIG. 3 shows the cross-sectional view of the fabricated semiconductor structure further including photoresist layered upon the previously deposited polysilicon layer.
Figure 4:
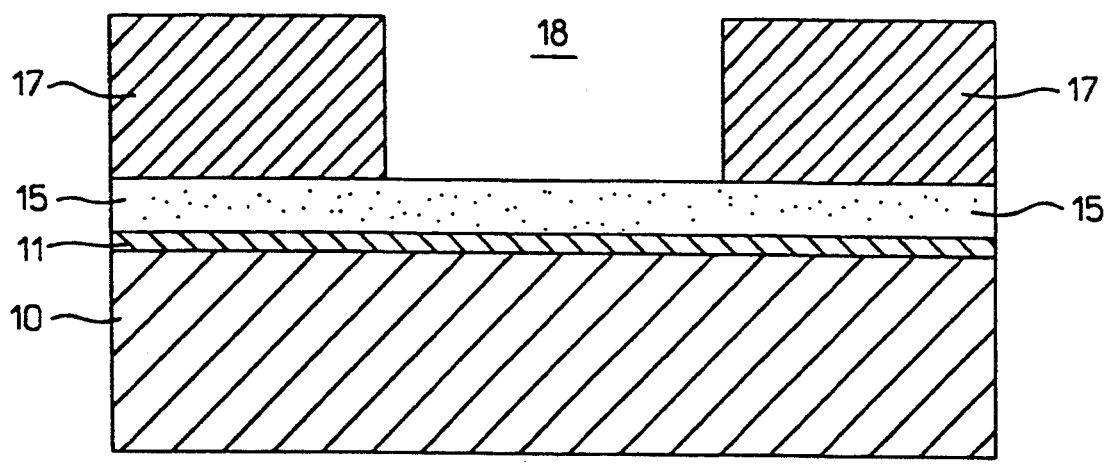
FIG. 4 shows the cross-sectional view the semiconductor structure of the invention including a photolithographically defined window in photoresist.
Figure 5:
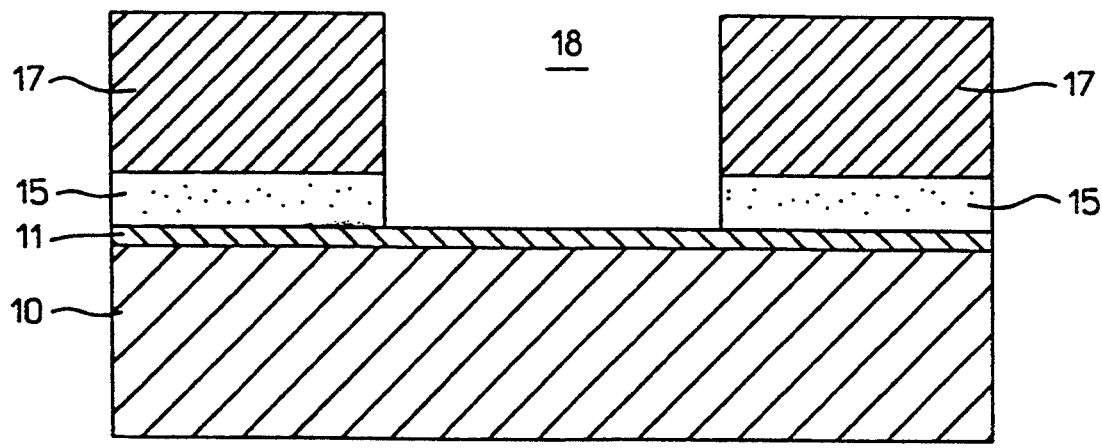
FIG. 5 illustrates the semiconductor structure of the invention with the window extending to the screen oxide level.
Figure 6:
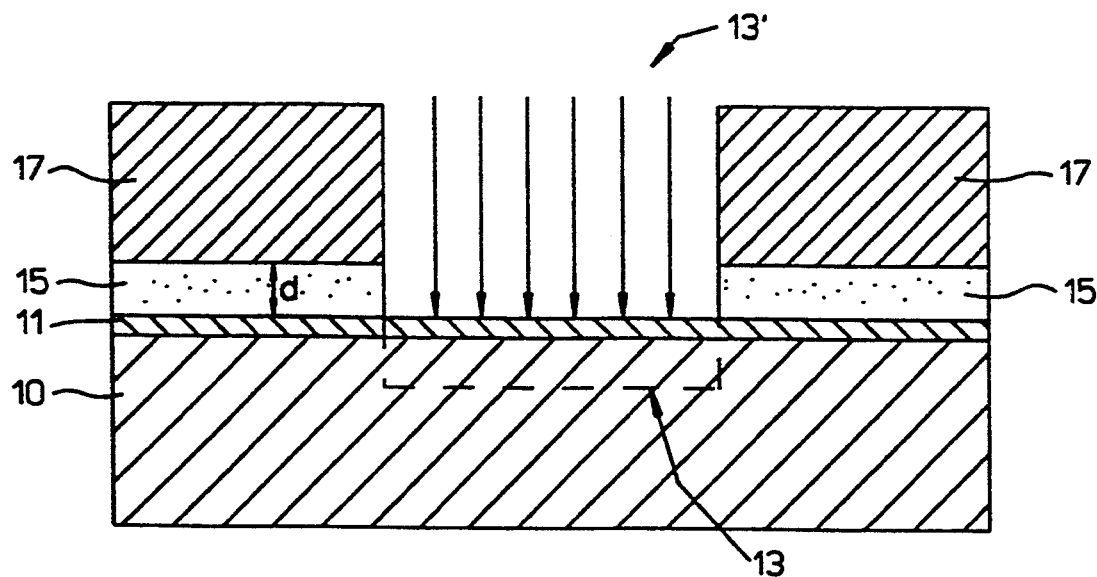
FIG. 6 illustrates the semiconductor structure of the invention including an indication of the dopant being introduced into the semiconductor substrate through the screen oxide layer.
Figure 8:
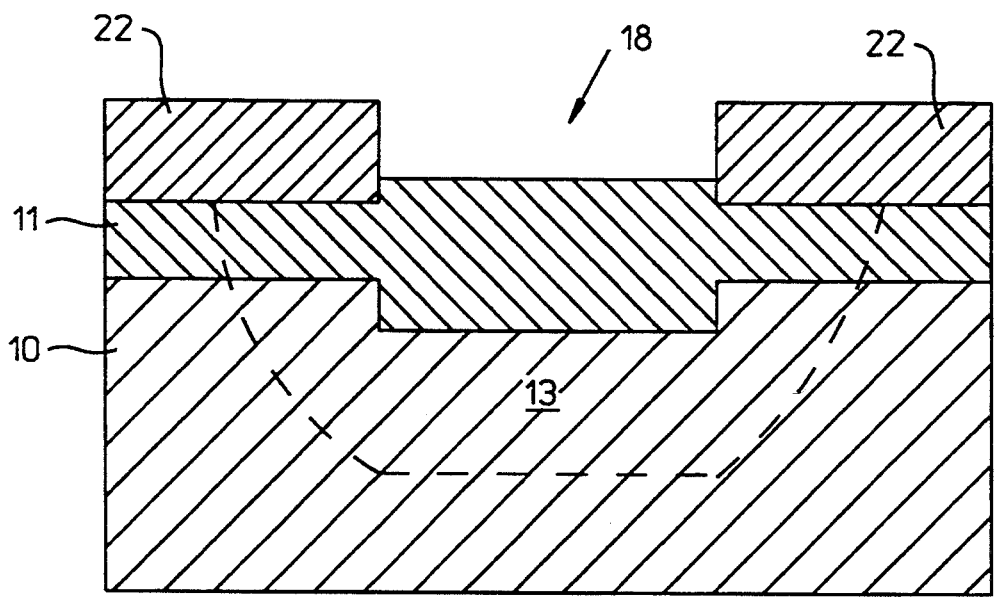
FIG. 8 shows the semiconductor structure of the invention with oxide growth having reached a maximum, extending through the polysilicon on the sides of the window and down into the substrate in parallel with and lagging the oxidation progress downward into doped window region by a predetermined distance corresponding to the initial thickness of the polysilicon layer.

In FIG. 3 there is shown the structure of FIG. 2 further including a predetermined photoresist layer 17 upon the polysilicon 15. This photoresist layer 17 is established according to conventional photolithographic steps well-known in the semiconductor arts. FIG. 4 shows the view of FIG. 3 with a photolithographic window 18 in photoresist layer 17 defining window 18 etched down to polysilicon layer 15. Etching is accomplished according to conventional semiconductor processes. FIG. 5 in turn illustrates the structure of FIG. 4 subject to dopant penetration into silicon crystal in regions defined by window 18 after the window portion of polysilicon layer 15 has been etched through. Preferred dopant materials according to the invention include for example arsenic, antimony, and (for CMOS applications) phosphorus or boron, but the dopant materials are not limited to the ones here specified. Implantation is preferably conducted according to well-known ion implantation techniques, including for example ion-beam implantation. As shown in FIG. 6, the semiconductor structure of the invention includes the dopant being introduced by an ion-beam 13' into the semiconductor substrate 10 through the screen oxide layer 11 which is effective for protecting the silicon substrate 10 from contaminent metalic atoms applied incident to the ion-beam action, but not desirably applied to the silicon substrate 10. The thickness of the polysilicon layer 15 is indicated as having a width "d." This is the ultimate step difference between window and out-of-window oxidation levels resulting in FIG. 8, as discussed below.

Figure 7:
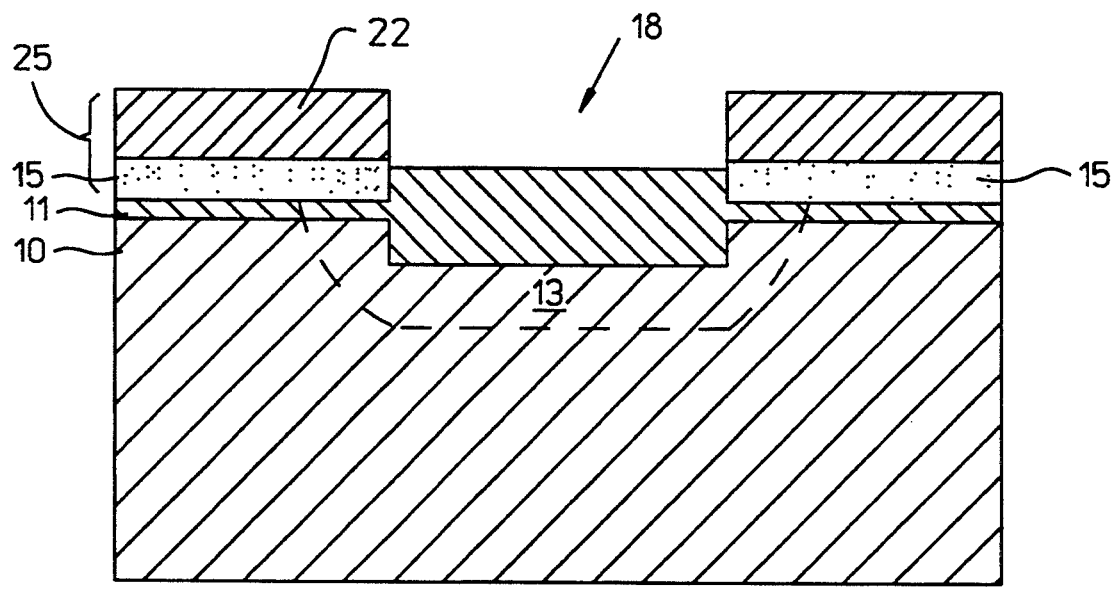
FIG. 7 shows the semiconductor structure of the invention herein with the photoresist pattern removed, with the dopant activated and distributed by annealing operation, and with many of the crystalline imperfections having been oxidized away, leaving a layer of thermal oxide about predefined windows of predetermined height predefined to the thickness of the earlier established polysilicon layer.

Shown in FIG. 7 is the fabricated structure of the invention herein, in which photoresist layer 17 defining the implantation windows of former steps has been removed. This figure shows dopant region 13 at the completion of activation and annealing. At this stage, the undesired crystalline imperfections in the target semiconductor structure are being oxidized away. Oxidation occurs according to well-known semiconductor processes, as for example in furnaces typically employed for that purpose. In FIG. 7, a portion of the polysilicon layer 15 has been oxidized away, with the already oxidized upper portion expanding in height and volume. What is left is a rising layer of thermal oxide 22 about the predefined windows at the desired, predetermined height 25 which is beyond the thickness of the earlier fabricated polysilicon layer 15 originally defined upon the screen oxide layer 11 grown over substrate wafer 10. Oxidation is shown at an advanced state in the window region as well, with the screen oxide layer 11 expanding in an upward direction, and oxidation proceeding as well downward into the already doped region 13 below the screen oxide 11 of the window region. As will be seen in connection with FIG. 8, the downward oxidation proceeds into the substrate in the window region long before the substrate outside the window region is subject to oxidation. This delay in oxidation, produces the desired relative oxide level difference within and without the window region.

Aside from thereby providing an implanted layer of dopant for bipolar applications as discussed in detail and subject to the details of well-known bipolar process steps, this invention can be applied usefully to establish the n-wells of the p-channels in CMOS devices, in accordance with the steps of well-known CMOS processes. According to FIG. 8, the target semiconductor structure of the invention is shown with oxide growth having reached a maximum, extending through the polysilicon layer 15 and substantially doubling the thickness of the original polysilicon layer 15 as it becomes oxidized. Oxidation in the doped window region has progressed to a depth below the oxidation depth outside the frame of window region which is substantially equal to the original thickness of the polysilicon layer 15. Accordingly, the oxide level within the window region is at a predetermined level below the oxide level outside the window region, by a thickness or depth differential set by the original polysilicon layer 15. At this point, the polysilicon layer 15 has been completely oxidized and oxidation has proceeded though the level of the original screen oxide layer and into the substrate wafer 10 itself. A relative oxide depth depression has thus been created by the delay in oxidation of the substrate during the time period the polysilicon layer 15 has been consumed by oxidation.

Figure 9:
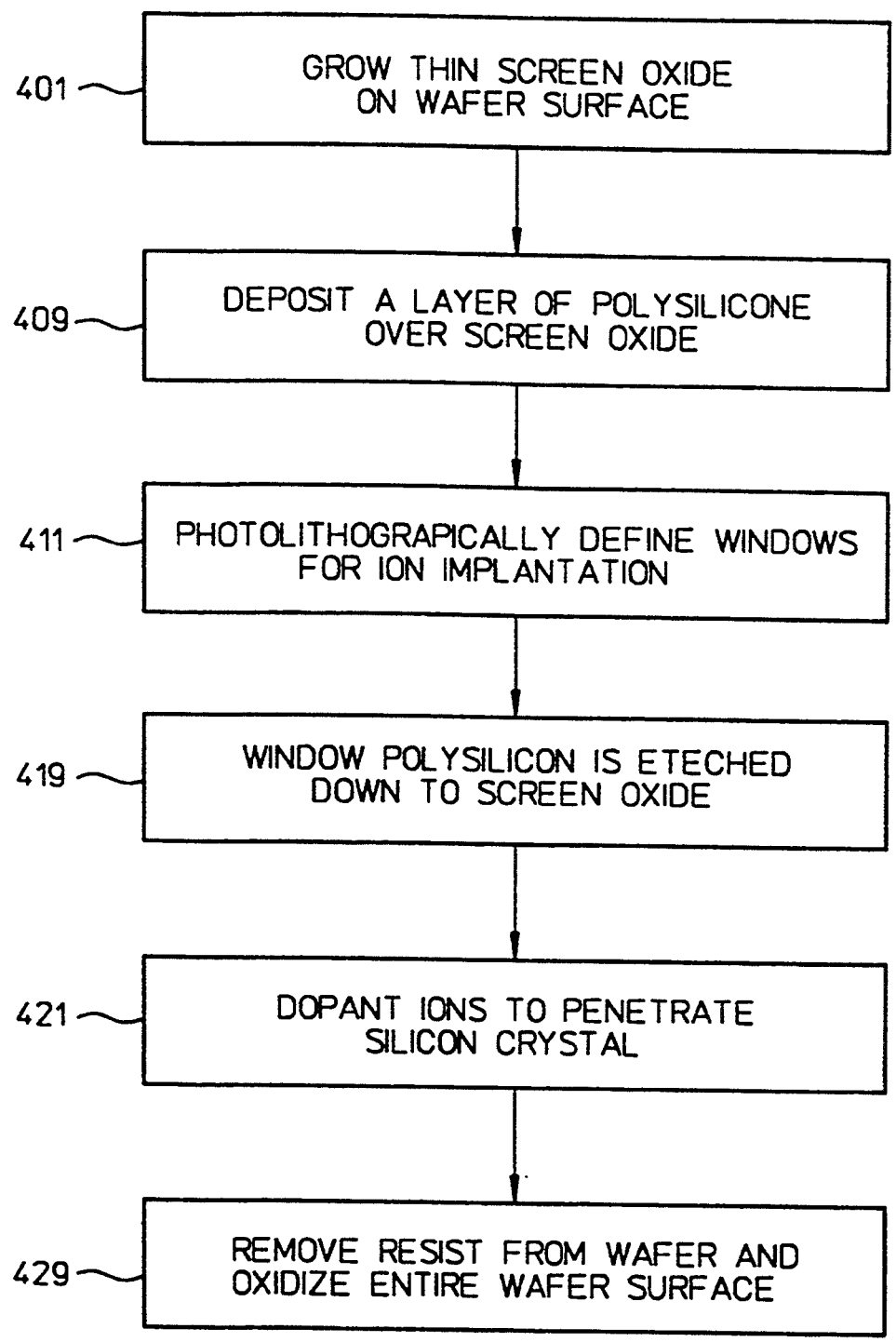
FIG. 9 is a flowchart of the inventive process steps taken to fabricate the semiconductor structure of the invention herein.

By way of summary of the process steps of the invention, FIG. 9 illustrates the method of fabricating the structures set forth in FIGS. 1-8, according to a flow chart scheme. As suggested above by reference to FIG. 1 and to step 401 in FIG. 9, a primary step of the process of this invention is to grow a thin screen oxide layer 11 upon the surface of a semiconductor wafer or substrate 10. A next step of the process, according to step 409 in FIG. 9 and according to FIG. 2 generally, is to deposit a layer of polysilicon 15 over the screen oxide layer 11. The thickness of the layer of polysilicon 15 is equal to the topographic steps and recesses desired in the silicon surface. Another step, i.e., step 411 in FIG. 9 and in FIG. 4 generally, is to photolithographically define the windows 18 effective for ion implantation of the buried layers of dopant 13. The window polysilicon material 15 is then etched down to the screen oxide layer 11 within the bounds of window 18, according to step 419 in FIG. 9 and also FIG. 5 generally. The resist layer 17, now open in the region of photolithographic window 18, is retained to permit dopant ions to penetrate silicon crystal within the windowed regions only, as per step 421 of FIG. 9 and generally according to FIG. 5. Finally, according to FIG. 9, the resist layer 17 is removed, and after an interval of time well known to one skilled in the semiconductor processing arts, annealing operation is undertaken, effective for activating the dopant ions, and removing crystalline imperfections. This is followed by oxidizing the entire wafer surface, and then etching away the oxide formed, followed by epitaxial silicon growth over the wafer surface.

The preferred embodiment described above illustrates but one way to carry out the invention contemplated. The actual metes and bounds of the invention are as claimed below:

What is claimed is:

1. The method of establishing a constant silicon recess of predetermined thickness in a semiconductor structure, including the steps of:
   a. growing an oxide layer on a semiconductor surface of a semiconductor structure;
   b. depositing a layer of polysilicon over the oxide layer;
   c. photolithographically defining at least a single window in said layer of polysilicon;
   d. etching away the layer of polysilicon in said at least a single window to the level of the oxide layer;
   e. ion implanting a selected dopant within said at least a single window; and
   f. annealing and then oxidizing the semiconductor surface sufficiently at least to completely oxidize the layer of polysilicon, whereby a constant silicon recess is established.

2. The method according to claim 1, wherein the step of photolithographically defining includes establishment of a resist pattern on the layer of polysilicon.

3. The method according to claim 2 including the step of removing the resist pattern after ion implanting.

4. The method according to claim 2, including the additional step of retaining the resist pattern to shield ion implanting and to enable dopant ions to penetrate the semiconductor surface within said at least a single window only.

5. The method according to claim 1, wherein the oxide layer is a screen layer of oxide.

6. The method according to claim 1, wherein the semiconductor surface is the surface of a semiconductor wafer.

7. The method according to claim 1, wherein the semiconductor surface is the surface of a semiconductor chip.

8. The method according to claim 1, wherein the semiconductor surface is subject to bipolar processing.

9. The method according to claim 1, wherein the semiconductor surface is subject to CMOS processing.

* * * * *

UNITED STATES PATENT AND TRADEMARK OFFICE
CERTIFICATE OF CORRECTION

PATENT NO. : 5,358,881
DATED : October 25, 1994
INVENTOR(S) : Donald L. Packwood It is certified that error appears in the above-indentified patent and that said Letters Patent is hereby corrected as shown below:

Column 5, line 52, "Fig. 5" should read -- Fig. 6 --.

Signed and Sealed this

Fourth Day of April, 1995

Attest:

BRUCE LEHMAN

Attesting Officer

Commissioner of Patents and Trademarks